United States Patent [19]

Kucera

[11] Patent Number: 5,930,172
[45] Date of Patent: Jul. 27, 1999

[54] PAGE BUFFER FOR A MULTI-LEVEL FLASH MEMORY WITH A LIMITED NUMBER OF LATCHES PER MEMORY CELL

[75] Inventor: Joe Kucera, Austin, Tex.

[73] Assignee: Advanced Micro Devices, Inc., Sunnyvale, Calif.

[21] Appl. No.: 09/103,041

[22] Filed: Jun. 23, 1998

[51] Int. Cl.$^6$ .................................................. G11C 7/00
[52] U.S. Cl. .............................. 365/185.21; 365/185.03; 365/189.05
[58] Field of Search ........................ 365/185.03, 185.21, 365/189.05, 185.33

[56] References Cited

U.S. PATENT DOCUMENTS 5,684,739  11/1997  Takeuchi ............................. 365/185.03
5,729,490   3/1998  Calligaro et al. ................... 365/185.03

Primary Examiner—Vu A. Le
Attorney, Agent, or Firm—Fliesler, Dubb, Meyer & Lovejoy

[57] ABSTRACT

A page buffer for a multi-level flash memory array as at least two less latches than threshold values which may be programmed into a memory cell. To enable use of such a page buffer a program/verify method for each cell programs a cell to the level of a most significant binary bit indicating the programming state for the cell. For example, when three threshold levels vt1, vt2 and vt3 are used, the most significant bit representing the threshold level to be programmed is stored in a page buffer latch (312) and the next most significant bit is stored in a page buffer latch (311). The latch (312) is read first and the cell (300) is programmed to vt2 if latch (312) stores a 0. During the program verify procedure, once the vt2 level is obtained, the latch (312) will toggle to a 1. To reuse the latch (312), the latch (312) is then preset to 0, and a read is performed with the latch (312) enabled if latch (311) stores a 0, enabling latch (312) to transition to a 1 if the memory cell (300) is to be programmed to a level vt3. A read is also performed with latch (311) enabled to enable latch (311) to transition to a 1 if the cell (300) is already programmed to vt2. If the latch (312) now stores a 1, the cell (300) is programmed to the level vt3. If the latch (311) stores a 0, the cell (300) is programmed to the level vt1. By reusing the latch (312) to represent the vt3 level in this manner, the third latch (313) is no longer required for programming.

3 Claims, 3 Drawing Sheets

PAGE BUFFER FOR A MULTI-LEVEL FLASH MEMORY WITH A LIMITED NUMBER OF LATCHES PER MEMORY CELL

BACKGROUND OF THE INVENTION

1. Field of the Invention

The present invention relates to a method for programming and verifying the programmed state for multi-level flash memory cells using a page buffer.

2. Description of the Related Art

Multi-level storage refers to the ability of a single memory cell to represent more than a single binary bit of data. A conventional memory cell depicts two states or levels, usually referred to as logic "0" and logic "1". A multi-level cell can represent many states.

Multi-level cell storage is obtainable in flash memory cells because a flash memory cell can be programmed to provide multiple threshold voltage (vt) levels. For example, in FIG. 1 four vt levels are shown, vt0–vt3, and a representation of the state stored by the memory cells can be provided using two binary bits labeled Q1 and Q2 as shown. Using flash memory cells, vt levels programmed can be sustained over time, even after repeated accesses to read data from the cell.

FIG. 2 shows a typical configuration for an integrated circuit including a flash memory array 200 and circuitry enabling programming, erasing, and reading or verifying the programming state for memory cells in the array 200. The flash memory array 200 is composed of individual cells, such as 202. Each cell has a drain connected to a bitline, such as 204. Each bitline is connected to a bitline pull up circuit 206 and column decoder 208. Sources of the array cells are connected to Vss, while gates are each connected by a wordline to a row decoder 210.

The row decoder 210 receives voltage signals from a power supply 212 and distributes the particular voltage signals to the wordlines as controlled by a row address received from a processor 214. Likewise, the bitline pull up circuit 206 receives voltage signals from the power supply 212 and distributes the particular voltage signals to the bitlines as controlled by a signal from the processor 214.

The column decoder 208 provides signals from particular bitlines to sense amplifiers or comparators 216 as controlled by a column address signal from processor 214. The sense amplifiers 116 further receive a voltage reference signal from reference 118 to enable reading, as described in more detail below. The outputs from sense amplifiers 216 can be provided to a page buffer 220 which has outputs connected back to processor 214. The outputs of the sense amplifiers 216 can also be connected directly back to the processor 214 if a page buffer 220 is not desired.

To program a cell in the flash memory array 200, high gate-to-drain voltage pulses are provided to the cell from power supply 212 while a source of the cell is grounded. For instance, during programming typical gate voltage pulses of 10V are each applied to a cell, while a drain voltage of the cell is set to 5.5V and its source is grounded. This programming procedure results in an increase of a threshold voltage for the cell, the threshold being the gate-to-source voltage required for the cell to conduct.

To erase a cell in the flash memory array 200, relatively high negative gate-to-source voltage pulses are applied. For instance, during erase gate voltage pulses of –10V are applied to a cell, while a drain of the cell is set to 5.5V and its source is floated. The large negative gate-to-source voltage pulses reduce the threshold of the cell.

To determine if a cell is programmed or erased to a desired threshold level, a read or verify procedure is applied after each program or erase pulse. During verify, a gate or wordline voltage $WL_1$–$WL_3$ is applied to a cell as illustrated in FIG. 1. The bitline output (BL) from a cell 300 being read is received at an input of one of the sense amplifiers 302 in sense amplifiers 216, as illustrated in FIG. 3. A second input to the sense amplifier 302 is provided from the reference 218. The reference 218 provides a minimal current so that if the wordline voltage WL is greater than the vt level of a cell, the output of sense amplifier 302 will indicate a first state, and if the wordline voltage is less than the vt level of the cell, the output of sense amplifier 302 will indicate a second state. Program or erase pulses are applied with a verify procedure between each pulse until the output of sense amplifier 302 toggles to indicate a desired vt level is obtained.

To enable more rapid reading of a state stored by a memory cell, a page buffer 220 containing latches can be connected to the outputs of sense amplifiers 216, as further shown in FIG. 2, and as shown in detail in FIG. 3. The page buffer 220 reduces read time since the latches of the page buffer 220 store the memory cell state after a first read operation so that subsequent read operations involving the memory cell are not required.

FIG. 3 shows three latches 311–313 of a page buffer 220 coupled to the output of a memory cell 300. If the output of sense amplifier 302 is high, the transistor 340 will turn on and overcome current source 342 and pull down node 350. If the output of sense amplifier 302 is low, the transistor 340 will turn off and current source 342 will pull up node 350. A latch enable signal can be applied to one of transistors 331–333 to connect the node 350 to a respective one of the latches 311–313. The respective latch will then store the state of node 350.

During a verify operation, each latch enable is separately applied to transistors 331–333 depending on the level of the wordline voltage WL applied to the memory cell. For example, for a vt1 level, the latch 311 is enabled by applying an enable signal to transistor 331 and a word line voltage is applied at the $WL_1$ level as shown in FIG. 1. The latch 311 will then indicate if the threshold of the memory cell 300 is below $WL_1$ or above $WL_1$ at vt1, referring to the program states of FIG. 1. Similarly, the latch 312 is enabled using a transistor 332 when a wordline voltage at the $WL_2$ level is applied to determine if the cell is programmed to vt2, and the latch 313 is enabled using transistor 333 and a wordline voltage $WL_3$ is applied to determine if a cell is programmed to the vt3 level. The state of the latches 311–313 after applying wordline voltages $WL_1$–$WL_3$ and enabling the appropriate latches indicates the state stored by the memory cell 300.

Note that the wordline levels $WL_1$–$WL_3$ in FIG. 1 are between the vt1–vt3 levels. The hatch marks illustrate a spectrum of vt states for each of the levels vt0–vt3. During a typical program/verify procedure, after each program pulse is applied, one of the word line voltages $WL_1$–$WL_3$ is applied to a cell. When the cell conducts during a verify procedure, the cell is programmed above the desired wordline voltage to one of the levels vt1–vt3 and programming is complete. For an erase procedure, erase pulses are applied until a cell having $WL_1$ applied as a gate voltage no longer conducts indicating it has a threshold at vt0.

To program an array of cells, all cells are typically erased first. Memory cells are then programmed in an order according to a threshold level to be stored. For instance, all memory cells having a vt1 state are programmed first. Once programming is complete for all memory cells having a vt1 state, programming is performed for all cells having the vt2 state. Once programming for cells having a vt2 state is complete, all cells are programmed having a vt3 state, and so forth.

To facilitate programming, data to be stored in a memory cell can be preloaded into the page buffer latches using signals provided to the preset connection such as the prst0–prst3 connections to latches 311–313 of FIG. 3. For example, a "0" can be preset into latches where it is desired to cause the corresponding flash cell to program to a higher vt level, while a "1" is preset into the remaining latches. The cells having a latch with a "0" state will have programming pulses applied until the latch with a "0" state transitions to a "1" state. For example, loading latch 311 with 0, latch 312 with 1, and latch 313 with 1 and following the above programming procedure will cause the vt of cell 300 to be raised from the erase vt0 level to the vt1 level during programming.

SUMMARY OF THE INVENTION

The present invention provides a method for programming multi-level flash memory cells which reduces the time required for programming compared to conventional programming techniques.

The present invention further reduces the amount of circuitry needed for verifying the programming state for multi-level flash memory cells.

The present invention includes a program/verify method, wherein a most significant binary bit representing a threshold value to be programmed into a cell is read first and the cell is programmed to the minimum threshold level represented by the most significant bit. The next most significant bit is then read and further programming pulses are applied if needed to complete programming. By programming to the level of the most significant bit first, rather than programming to each possible threshold separately as determined by all bits read together, less time is required for programming an array.

With such a programming method, the present invention further includes a method of storing data during a program/verify procedure so at least two less latches than possible threshold states can be used in a page buffer for each memory cell during programming. To enable use of less latches, a latch storing the most significant bit representing a threshold value to be programmed can be reused.

For example, when three threshold levels vt1, vt2 and vt3 are used, referring to FIG. 3, the most significant bit representing the threshold level to be programmed is stored in a page buffer latch 312 and the next most significant bit is stored in a page buffer latch 311. The latch 312 is read first and the cell 300 is programmed to vt2 if latch 312 stores a 0. During the program verify procedure once the vt2 level is obtained the latch 312 will toggle to a 1. To reuse the latch 312, the latch 312 is then preset to 0, and a read is performed with the latch 312 enabled if latch 311 stores a 0, causing latch 312 to transition to a 1 if the memory cell 300 is to be programmed to a level vt3. The state of latch 312 is then inverted. A read is also performed with latch 311 enabled to enable latch 311 to transition to a 1 if the cell 300 is already programmed to vt2. If the latch 312 now stores a 0, the cell 300 is programmed to the level vt3. If the latch 311 stores a 0, the cell 300 is programmed to the level vt1. By reusing the latch 312 to represent the vt3 level in this manner, the third latch 313 is no longer required for programming.

BRIEF DESCRIPTION OF THE DRAWINGS

Further details of the present invention are explained with the help of the attached drawings in which.

DETAILED DESCRIPTION

The present invention includes a program/verify method which uses multiple binary bits to indicate the state to be programmed into each cell in an array of flash memory cells. In the program/verify method, a most significant binary bit representing a threshold value to be programmed into each cell is first read and the cells are programmed to the minimum threshold level represented by the most significant bit. The next most significant bit is then read and further programming pulses are applied if needed to complete programming.

Figure 1:
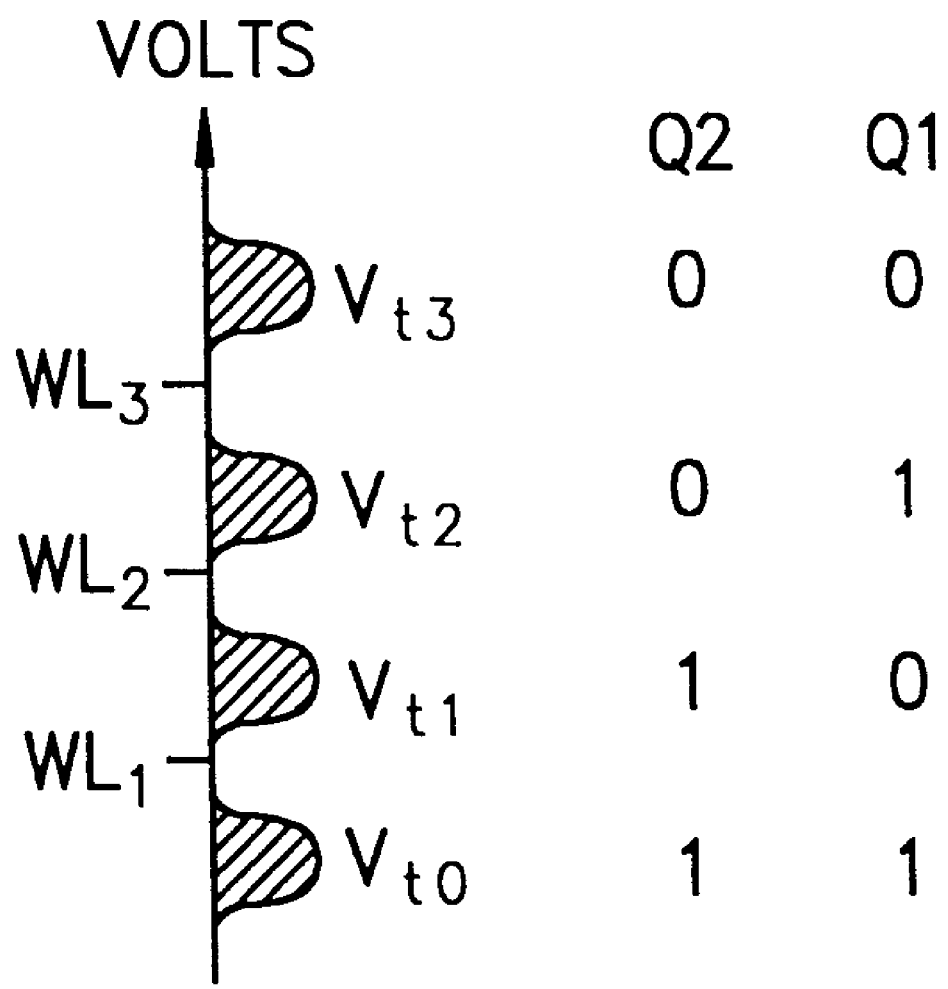
FIG. 1 shows threshold voltage levels vt0–vt3, binary values Q1–Q2 representing the threshold voltage values, and wordline values $WL_1$–$WL_3$ used to program the thresholds.
Figure 2:
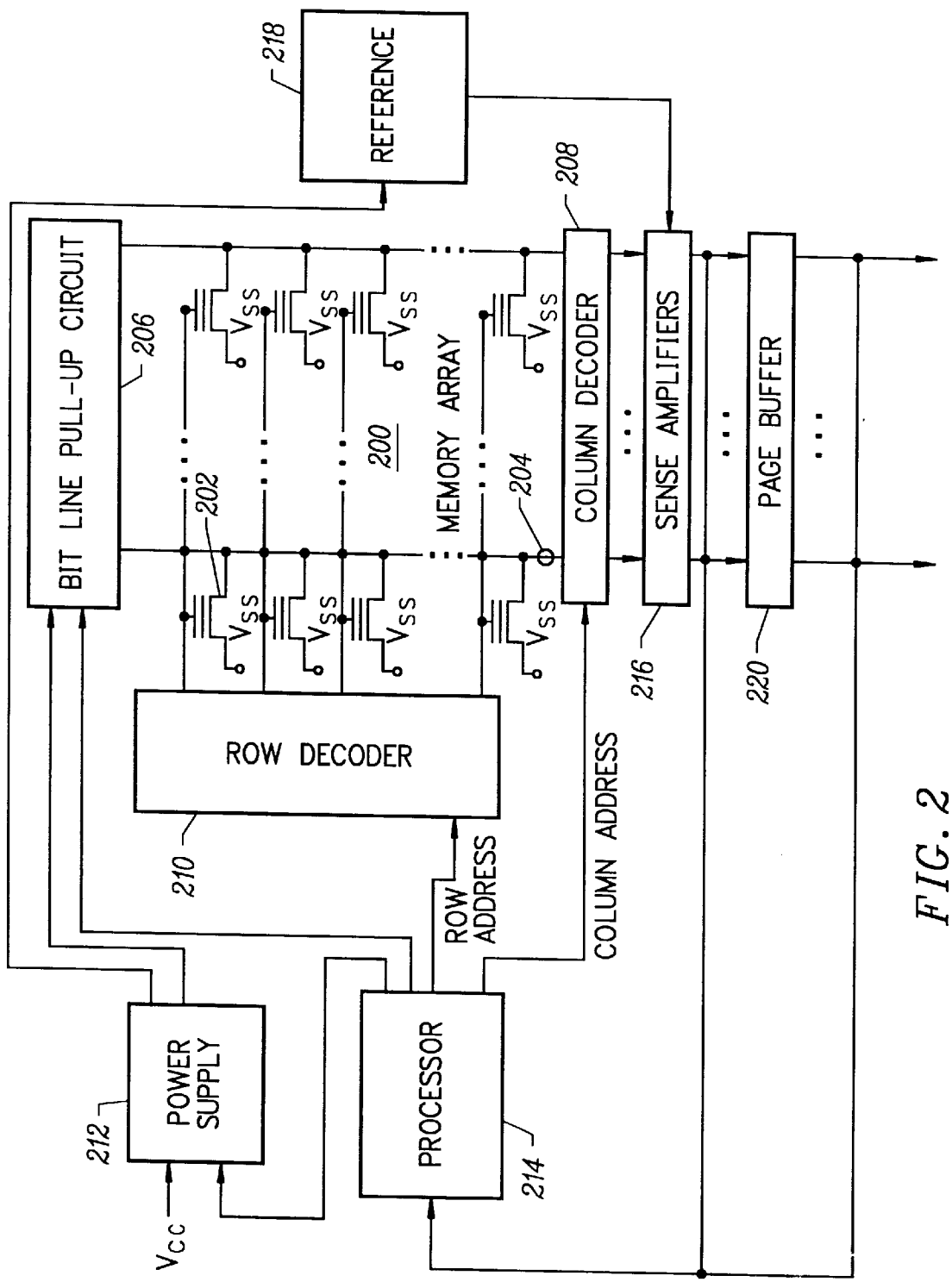
FIG. 2 shows a typical configuration for an integrated circuit including a flash memory array.

For example, with four possible vt levels vt0–vt3, as illustrated in FIG. 1, the bits Q1 and Q2 can be used to represent a desired programmed state. To begin the program/verify method of the present invention, all cells are first erased to a vt0 state. To program the cells to a desired level, the most significant binary bit Q2 will be read first for the cells. For all cells with a Q2 of 0, a program operation will be performed to raise the threshold level to vt2. Cells which are to be programmed to either the vt2 or vt3 levels are, thus, simultaneously programmed to the vt2 level.

After all cells with a Q2 of 0 are programmed to the vt2 level, the state of the binary bit Q1 in combination with the bit Q2 is used to enable programming of the remaining vt1 and vt3 levels. For instance, if both Q2 and Q1 are 0, additional programming pulses are applied to a cell to increase the cell threshold from vt2 to vt3. If Q2 is 1 and Q1 is 0, programming pulses are applied to raise a cell threshold to vt1.

With the flash memory cell storing more than four possible vt levels, more than two binary bits will be needed to represent the desired vt programming levels. With more than two binary bits, the method of the present invention can be extended by first utilizing the most significant binary bit alone to program cells, then using a second most significant bit in combination with the most significant binary bit to further program cells, and then using the third most significant bit in combination with the first and second bits and so forth.

Figure 3:
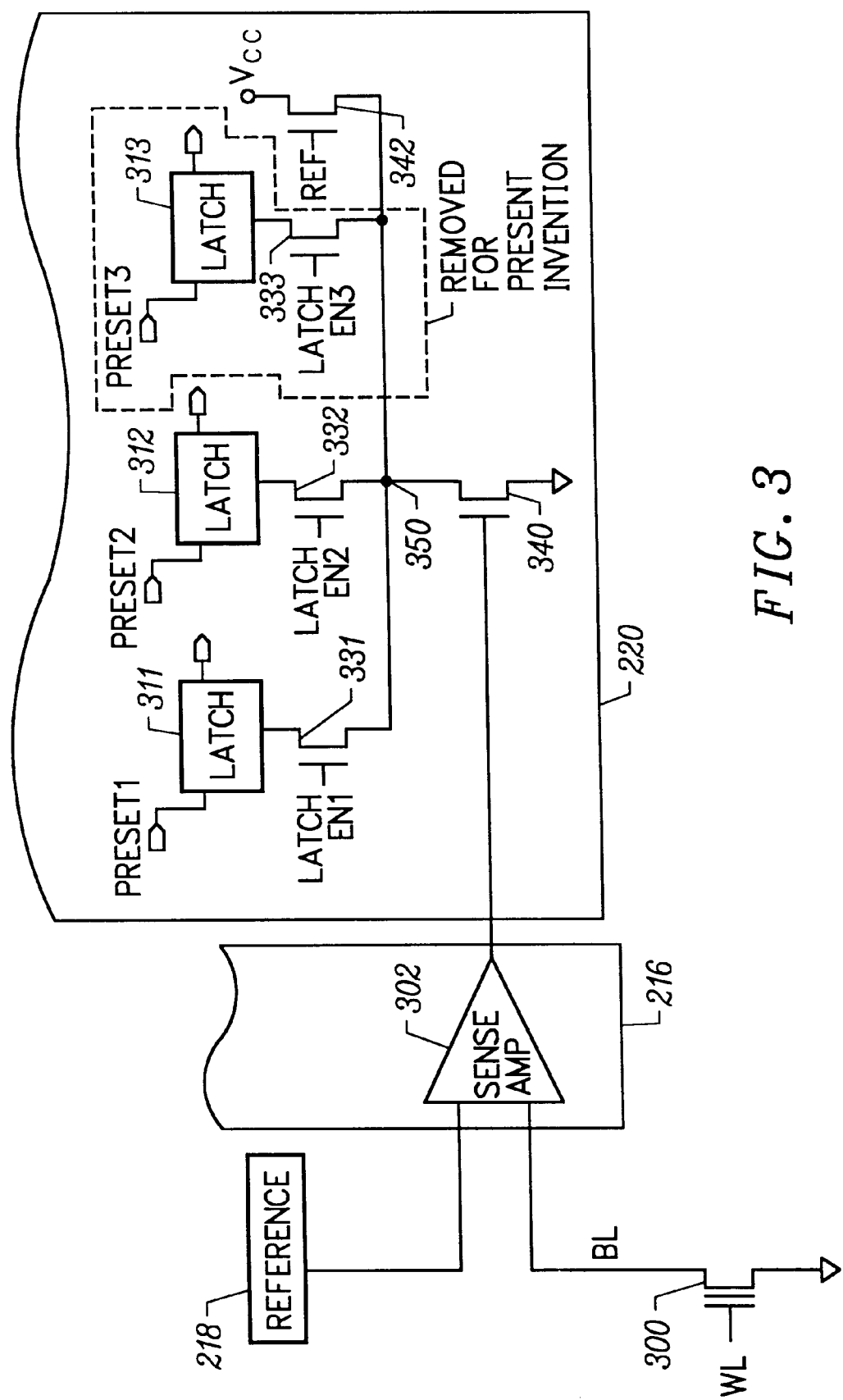
FIG. 3 shows details of the page buffer and sense amplifiers of FIG. 2.

With the programming method of the present invention as described, the present invention further includes a method of storing the binary bits representing vt programming levels in latches of a page buffer so that less latches are required than with conventional program/verify methods. For example, with memory cells storing four possible threshold levels vt0–vt3 as shown in FIG. 1, the latch 313 and latch enable transistor 333 of FIG. 3 can be removed with the program/verify method of the present invention used.

To enable use of less latches, a latch storing the most significant binary bit representing a threshold value to be programmed is reused. For example, when four threshold levels vt0–vt3 are used as illustrated in FIG. 1, referring to FIG. 3, the program/verify method of the present invention initially stores the most significant bit Q2 in latch 312 and the next most significant bit Q1 in latch 311. After all cells are erased to the vt0 level, the latch 312 state is read, and if the latch stores a 0, the cell 300 is programmed to vt2. Similarly, other pairs of latches in the page buffer are preset to represent a desired programming state for other cell and the most significant bit is read to program all cells to vt2 which have a most significant bit of 0.

Once the vt2 level is programmed into a cell, its most significant latch bit will toggle from a 0 to a 1 during a verify process so that all latches storing a most significant bit for a cell now store a 1. Thus, the page buffer data will be identical for all cells to be programmed to the vt1 and vt3 levels with a most significant latch bit being 1 and a least significant latch bit being 0. Since the latch storing the most significant bit is no longer useful, it is reused to store data needed to distinguish between the vt1 and vt3 levels. Reusing the latch storing the most significant bit enables elimination of latches such as 313 of FIG. 3 and corresponding control circuitry, significantly reducing overall page buffer circuitry.

To reuse the latches which store the most significant bit for the cells, the latches storing the most significant bit for the cells are preset to zero. Next, a read of the memory cells is performed with the latch which stored the most significant bit enabled if the corresponding latch storing the next most significant bit stores a 0 to flip the most significant bit latches to 1 if their corresponding cell is to be programmed to the vt3 level.

Programming of cells to the vt1 level can now be performed. To do so first involves a verify operation with the latches storing the next most significant bit, such as 311 of FIG. 3, enabled. All such latches connected to a cell programmed to vt2 if storing a 0 will, thus, toggle to 1. The next most significant bit latches storing a 0 now represent cells which should be programmed to vt1. A program/verify procedure can now be performed to program such cells to vt1. Once programming is complete for those cells, all least significant bit latches will store a 1.

The only cells left to deal with are those which must be programmed to a vt3 level. Note that those cells have already been programmed to the vt2 level as described earlier. The cells remaining to be programmed to the vt3 level are indicated by the most significant bit page buffer latches which store a 1. Since cells to be programmed must have a 0 data value stored in their corresponding page buffer latches, the data stored in all of the most significant bit latches is inverted. The most significant bit latch is now set to 0 for cells remaining to be programmed from vt2 up to vt3. A program/verify procedure can now be performed to program such cells to vt3. Once programming is complete, all page buffer latches will store a 1.

With more than four vt states which can be programmed into a cell, more than one latch might be reused during the program/verify procedure following a method similar to the method described above. Overall page buffer circuitry can, thus, be reduced even further with greater numbers of vt levels being storable.

In summary, the two main advantages of the present invention are faster programming times and reduced circuit overhead and complexity. Faster programming results from simultaneously programming cells which store different threshold voltages. The simultaneous programming technique reduces overall programming time compared to programming each threshold level separately. Circuit overhead and complexity are reduced as a result of reusing page buffer latches. Without such page buffer latch reuse, additional latches and control circuitry for each memory cell would be required in a page buffer to store data for vt programming levels during programming.

Although the present invention has been described above with particularity, this was merely to teach one of ordinary skill in the art how to make and use the invention. Many additional modifications will fall within the scope of the invention, as that scope is defined by the claims which follow.

What is claimed is:

1. An integrated circuit comprising:

an array of flash memory cells, each cell having a control gate connected to a wordline in a row of wordlines, and a drain connected to a bitline in a column of bitlines;

a power supply receiving a control signal, the power supply being coupled to the bitlines and the wordlines for providing power supply signals;

a processor providing control signals to the power supply to enable selective reading of one of N possible threshold states stored by one of the flash memory cells, wherein N is an integer; and a page buffer comprising groups of latches each coupled to a given one of the bitlines, wherein each group of latches includes a number of latches limited to at least two less than the N possible threshold states per memory cell connected to the given bitline.

2. The integrated circuit of claim 1 wherein each group of latches further comprises:

a current source connected to a first node;

latch enable transistors, each having a source to drain path coupling one of the latches in the group of latches to a first node;

a current sink transistor having a gate coupled to the given bitline and a source to drain path connecting the first node to a first voltage potential; and a current source connected to the first node, the current source sourcing less current than the current sink.

3. The integrated circuit of claim 1, wherein the control signals provided by the processor cause the power supply to provide N voltage levels to the wordlines to enable reading of the N possible threshold states.

* * * * *